United States Patent [19]

Izawa

[11] Patent Number: 5,287,063
[45] Date of Patent: Feb. 15, 1994

[54] CALIBRATION CIRCUIT AND METHOD FOR MAXIMUM AND MINIMUM VALUE DETECTION APPARATUS

[75] Inventor: Masao Izawa, Kawasaki, Japan
[73] Assignee: Kikusui Electronics Corporation, Kanagawa, Japan
[21] Appl. No.: 777,638
[22] Filed: Oct. 16, 1991
[30] Foreign Application Priority Data

Oct. 18, 1990 [JP]   Japan ................................ 2-277847

[51] Int. Cl.$^5$ .............................................. G01R 35/00
[52] U.S. Cl. .................................. 324/601; 324/130; 307/351
[58] Field of Search .................... 324/601, 130, 103 P; 307/351

[56] References Cited

U.S. PATENT DOCUMENTS

| | | | |
|---|---|---|---|
| 3,820,033 | 6/1974 | Iwata ...................... | 328/151 |
| 3,982,241 | 9/1976 | Lipcon ................. | 340/347 CC |
| 3,984,772 | 10/1976 | Bohler et al. ............. | 324/103 P |
| 4,069,452 | 1/1978 | Conway et al. ............. | 324/103 P |
| 4,213,085 | 7/1980 | Ramer ....................... | 324/103 P X |
| 4,779,039 | 10/1988 | Baker ........................ | 324/130 |
| 4,806,848 | 2/1989 | Demers ....................... | 324/601 |

*Primary Examiner*—Michael J. Tokar
*Assistant Examiner*—Glenn W. Brown
*Attorney, Agent, or Firm*—Finnegan, Henderson, Farabow, Garrett & Dunner

[57] ABSTRACT

An automatic calibration circuit for a maximum and minimum value detection apparatus including a maximum value detection circuit for detecting and outputting a maximum value of an input signal, and a minimum value detection circuit for detecting and outputting a minimum value of the input signal. In a calibration mode, a reference signal of a fixed value is automatically inputted to the maximum value detection circuit and to the minimum value detection circuit upon entry of a calibration mode. An offset voltage of at least one of the maximum value detection circuit and the minimum value detection circuit is automatically adjusted so that the maximum value and the minimum value obtained in response to the reference signal become equal.

16 Claims, 9 Drawing Sheets

CALIBRATION CIRCUIT AND METHOD FOR MAXIMUM AND MINIMUM VALUE DETECTION APPARATUS

BACKGROUND OF THE INVENTION

1. Field of the Invention

The present invention relates to a calibration circuit and method for a maximum and minimum value detection apparatus that detects maximum and minimum values of an input signal.

2. Description of the Related Art

Maximum and minimum value detection apparatuses are known to be used in digital oscilloscopes or the like.

A digital oscilloscope displays an input signal after converting the input signal to a digital signal by sampling the input signal. Consequently, when the input signal includes frequency components higher than the Nyquist frequency or half of the sampling frequency, so-called aliasing arises. A maximum and minimum value detection apparatus has been employed to prevent adverse effects by such an aliasing phenomenon, or to display envelopes of the input signal.

Maximum and minimum value detection apparatuses are roughly divided into two classes: one processing an input signal with a digital circuit; and the other processing an input signal with an analog circuit.

A digital type maximum and minimum value detection apparatus, which processes an input signal by using a digital circuit, samples an input signal at a sampling rate which is higher than the standard sampling rate at which the input signal is sampled, and then sequentially compares the sampled data. The maximum value detection apparatus holds the greatest value sampled over a predetermined interval and the minimum value detection apparatus holds the lowest value sampled over that interval. This process is performed over several predetermined detection intervals, thus yielding the maximum value and the minimum value for each of those intervals.

The digital type maximum and minimum value detection apparatus has a problem in that a maximum or minimum value of an interval between two adjacent sampling points cannot be detected because the sampling is a discrete operation, and hence does not continually detect the input signal during the interval.

On the other hand, an analog type maximum and minimum value detection apparatus that processes the input signal with an analog circuit can continually detect a maximum or minimum value in the predetermined detection interval because it operates continuously even between the sampling points of a digital oscilloscope.

FIG. 1 is a block diagram showing an arrangement of the analog type maximum and minimum value detection apparatus. In FIG. 1, reference numeral 71 designates a maximum value detection circuit; 72, a minimum value detection circuit; and 73, a preset adjuster for manually adjusting an offset of the minimum value detection circuit 72.

The maximum value detection circuit 31 has an arrangement as shown in FIG. 2. In FIG. 2, a charging amplifier 1 charges a capacitor 2 through a diode 3. The capacitor 2 is discharged through a resistor 4 and a switch 5 is closed by a reset signal. The output of the capacitor 2 is produced via a buffer amplifier 6.

On the other hand, the minimum value detection circuit 72 has an arrangement as shown in FIG. 3. The corresponding parts in FIGS. 2 and 3 are designated by the same reference numerals. The minimum value detection circuit 72 differs from the maximum value detection circuit 71 in that a diode 7 is connected in the direction opposite to that of the diode 3, and that a voltage outputted from a preset adjuster 73 is applied to an offset voltage adjusting terminal of the buffer amplifier 6. Furthermore, a charging amplifier 8 of the minimum value detection circuit 72 uses opposite conductivity type semiconductors to those of the charging amplifier 1 of the maximum detection circuit 71, and the polarity of power supplies of the circuits 71 and 72 are also opposite in polarity.

In the maximum value detection circuit 71 thus constructed, the capacitor 2 is charged up to a maximum value of an input signal by the charging amplifier 1, and the voltage of the capacitor 2 is outputted from the buffer amplifier 6. In contrast, in the minimum value detection circuit 72, the capacitor 2 is charged to a minimum value of an input signal, and the voltage of the capacitor 2 is outputted from the buffer amplifier 6. In a calibration mode, a signal of a predetermined level is applied by an operator to the inputs of the maximum value detection circuit 71 and the minimum value detection circuit 72, and the offset voltage of the minimum value detection circuit 72 is adjusted by an operator's manipulation of the preset adjuster 43 so that the output levels of the two circuits 71 and 72 become identical.

The maximum value detection circuit 71 and the minimum value detection circuit 72 which process analog signals have their peculiar output offset voltages which are liable to be varied by ambient conditions or the like. Accordingly, even when a DC voltage applied by an operator to the circuits 71 and 72 is maintained at a fixed value, it is very probable that the outputs of these circuits will become different over time.

Thus, when the maximum value detection circuit and the minimum value detection circuit 72 with the preset adjuster 73 are constructed from commercially available discrete parts, the following problem arises: the output offset voltages of the circuits 71 and 72 change independently owing to temperature variation or deterioration with age, and hence, it is unavoidable that errors are included in observation results even when errors of the output offset voltages of the circuits 71 and 72 have been initially canceled by operator adjustment of the preset adjuster 33.

FIG. 4 shows another technique to reduce the errors of the maximum and minimum value detection apparatus. The detection apparatus includes a differential amplifier 83, and two identically arranged maximum value detection circuits 81 and 82. The noninverted output and inverted output of the differential amplifier 83 are fed to the maximum value detection circuits 81 and 82, respectively. This makes it possible to reduce the difference between the characteristics of the two circuits 81 and 82. Here, the minimum value of the input signal becomes the maximum value at the inverted side, and hence, the output of the maximum value detection circuit 82 produces the minimum value of the input signal.

Furthermore, to eliminate errors of a maximum value detection circuit and a minimum value detection circuit, characteristics of semiconductor devices making up the circuits are matched by the following technique: the circuits are arranged on the same semiconductor pellet so as to integrate them into an IC; or the circuits are arranged by pair semiconductor devices having matched characteristics.

The conventional techniques to reduce the errors have a problem that the circuits become expensive compared with the circuits composed of commercially available discrete parts.

SUMMARY OF THE INVENTION

Accordingly, it is an object of the present invention to provide a low cost calibration circuit and method for a maximum and minimum value detection apparatus by using commercially available components.

It is another object of the present invention to provide a calibration circuit and method of a maximum and minimum value detection apparatus that can readily eliminate a mismatch between output offset voltages of a maximum value detection circuit and a minimum value detection circuit so that the maximum and minimum values of an input signal can be detected with high accuracy.

To achieve the foregoing objects and in accordance with the purposes of the invention as embodied and broadly described herein, a calibration circuit for a maximum and minimum value detection apparatus is provided which comprises a maximum value detection circuit for detecting and outputting a maximum value of an input signal; a minimum value detection circuit for detecting and outputting a minimum value of the input signal; a reference signal generating circuit for generating a reference signal of a fixed value which is automatically inputted to the maximum value detection circuit and to the minimum value detection circuit upon entry of a calibration mode; and an offset control circuit for automatically controlling an offset voltage of at least one of the maximum value detection circuit and the minimum value detection circuit so that the maximum value and the minimum value obtained in response to the reference signal becomes equal. The minimum value detection circuit may in fact comprise a second maximum value detection circuit. The calibration circuit may further include a circuit for automatically and repeatedly entering the calibration mode during the intervals when no input signal is being acquired.

According to the present invention thus arranged, when the offset outputs of the maximum value detection circuit and the minimum value detection circuit are different, the two circuits produce different outputs in response to a reference signal supplied from the reference signal generating means. The offset control means automatically detects the difference of the outputs, and adjusts at least one of the two circuits so that the output difference of the two circuits is eliminated without manual intervention. The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 5:
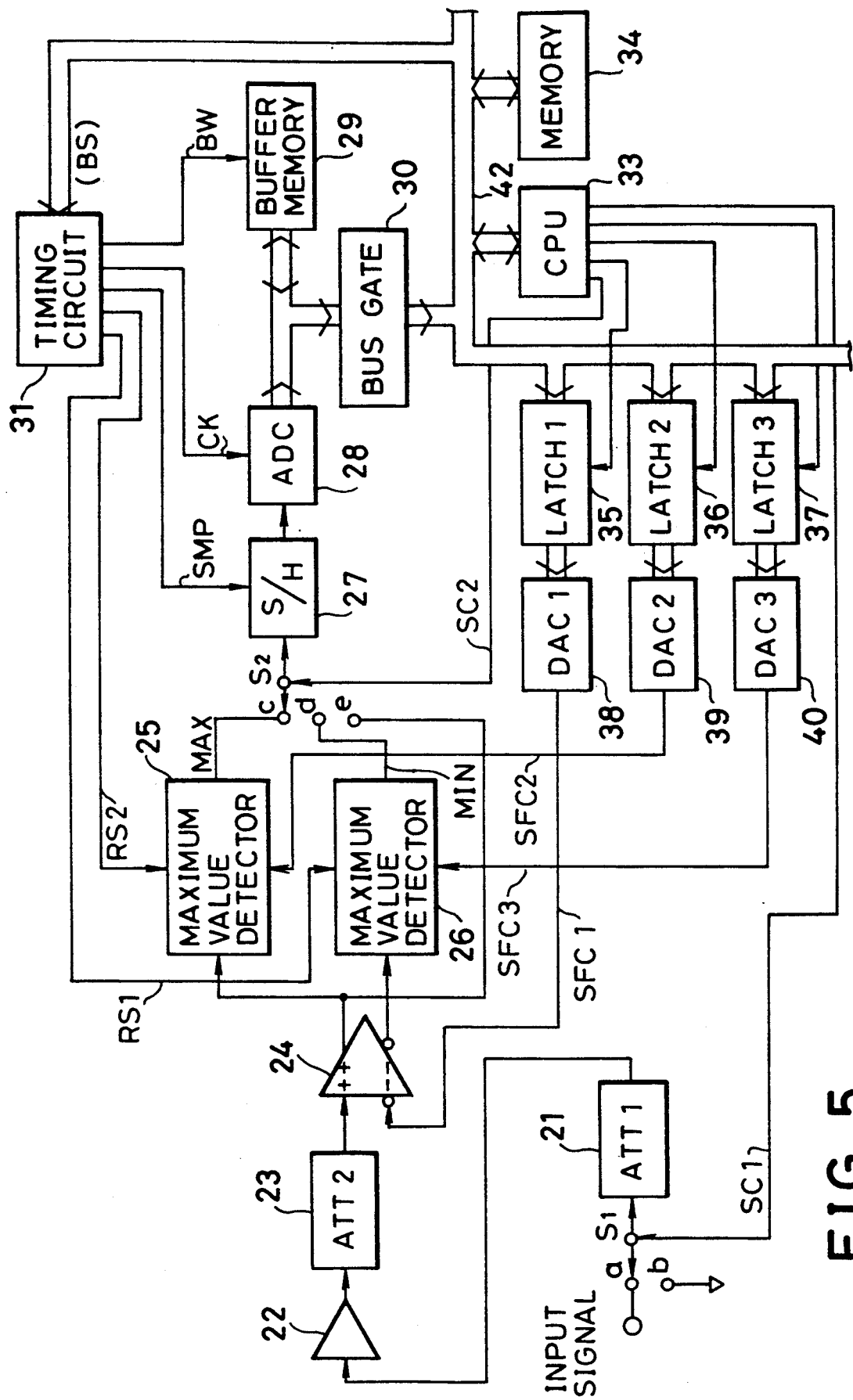
FIG. 5 is a block diagram showing an arrangement of a first embodiment of a maximum and minimum value detection apparatus according to the present invention.

FIG. 5 is a block diagram showing a basic arrangement of a first embodiment of the present invention.

In FIG. 5, an input signal is applied to the noninverting input terminal of a differential amplifier 24 by way of a switch S1, an attenuator 21, a buffer amplifier 22 and another attenuator 23. The noninverted output of the differential amplifier 24 is fed to a maximum value detection circuit 25 and to a terminal e of a switch S2, whereas the inverted output of the differential amplifier is supplied to another maximum value detection circuit 26. Thus, the maximum value detection circuit 26 outputs a negative maximum value, that is, a minimum value.

The maximum value detection circuit 25 detects the maximum value of the input signal during a predetermined detection interval, and is reset by a reset signal RS2 entered for each detection interval. The maximum value detection circuit 26 detects the minimum value of the input signal during the predetermined detection interval, and is reset by a reset signal RS1 entered for each detection interval.

Figure 1:
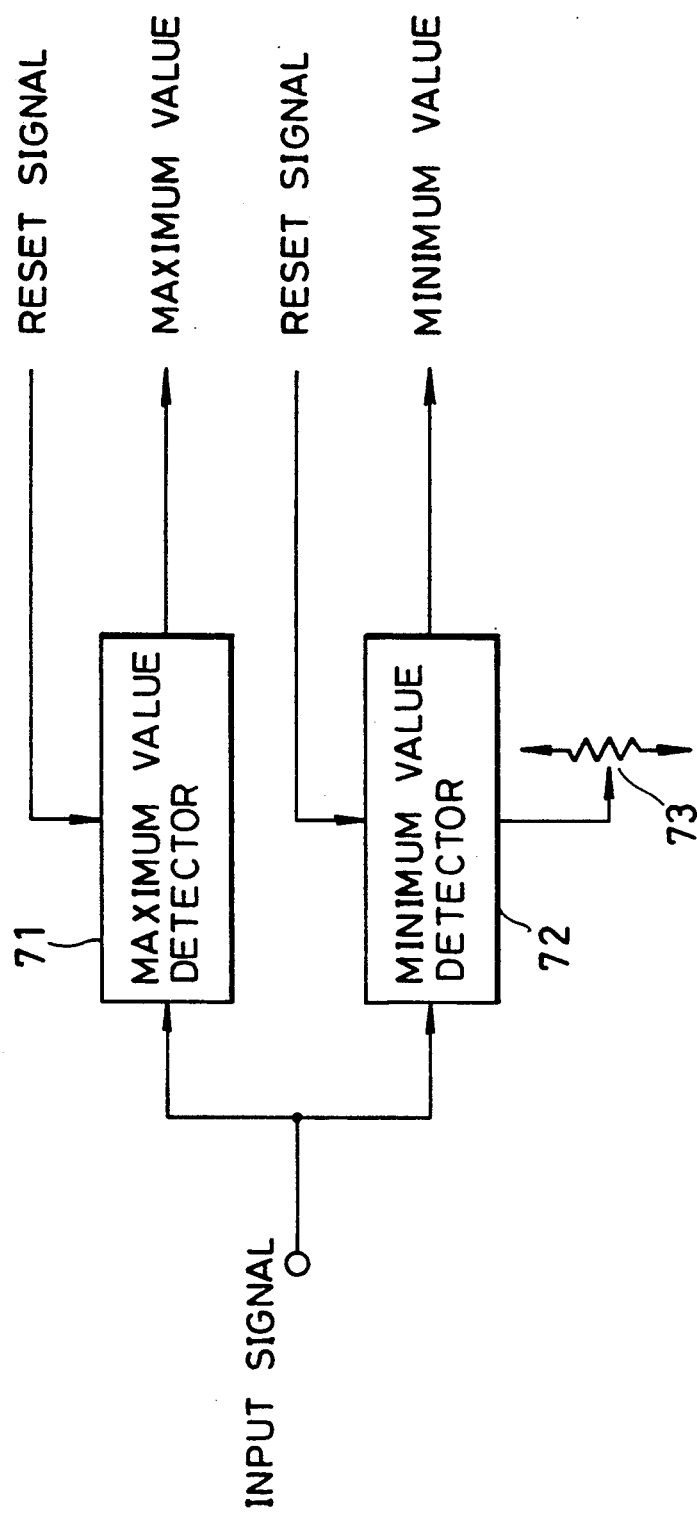
FIG. 1 is a block diagram showing an arrangement of a conventional maximum and minimum value detection apparatus.
Figure 2:
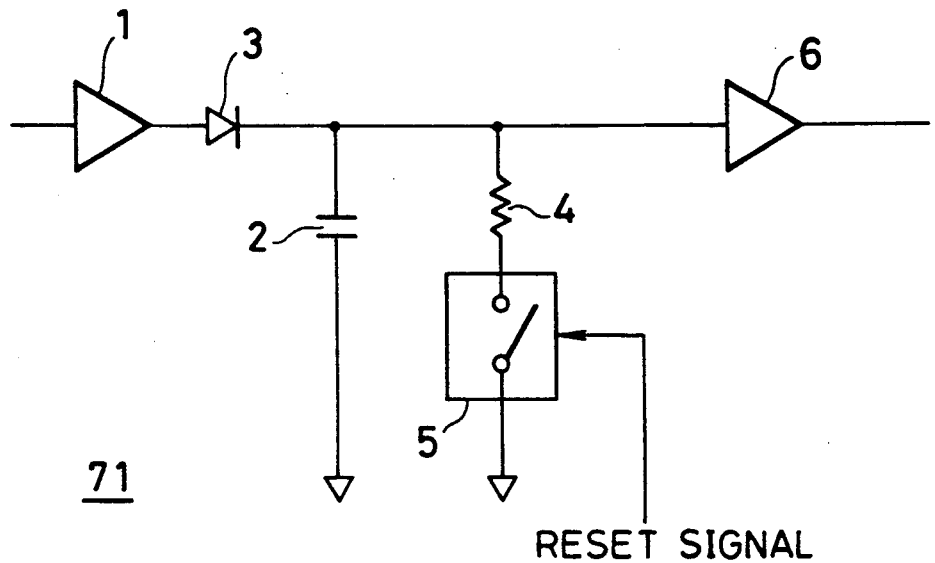
FIG. 2 is a circuit diagram showing an arrangement of a maximum value detection circuit.

Here, the maximum value detection circuits 25 and 26 have an analog circuit arrangement as shown in FIG. 2. Offset control signals SFC2 and SFC3 are supplied to offset voltage adjusting terminals of the buffer amplifiers 6 constituting the maximum value detection circuits 25 and 26, respectively.

A signal selected by the switch S2 is supplied to a sample-and-hold circuit 27, and then to an analog-to-digital converter 28, and is stored into a buffer memory 29, which are connected in cascade. Data stored in the buffer memory 29 is supplied to a CPU 33 via a bus gate 30. To the CPU 33, are connected via a CPU data bus 42, a timing circuit 31 for supplying timing signals to various portions of the apparatus, a memory 34, latches 35–37, and digital-to-analog converters 38–40.

Figure 6:
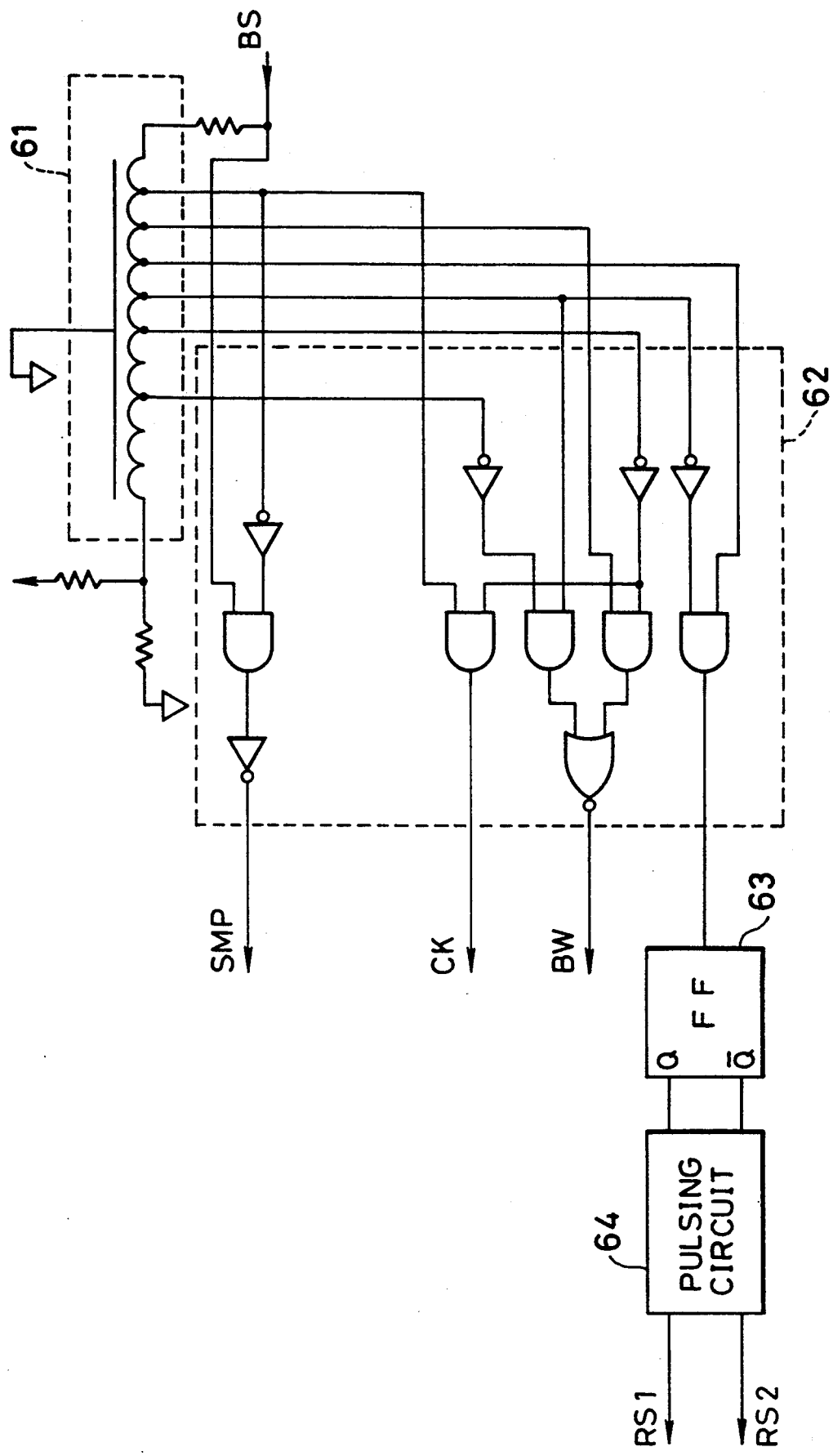
FIG. 6 is a circuit diagram showing an arrangement of a timing circuit.
Figure 7:
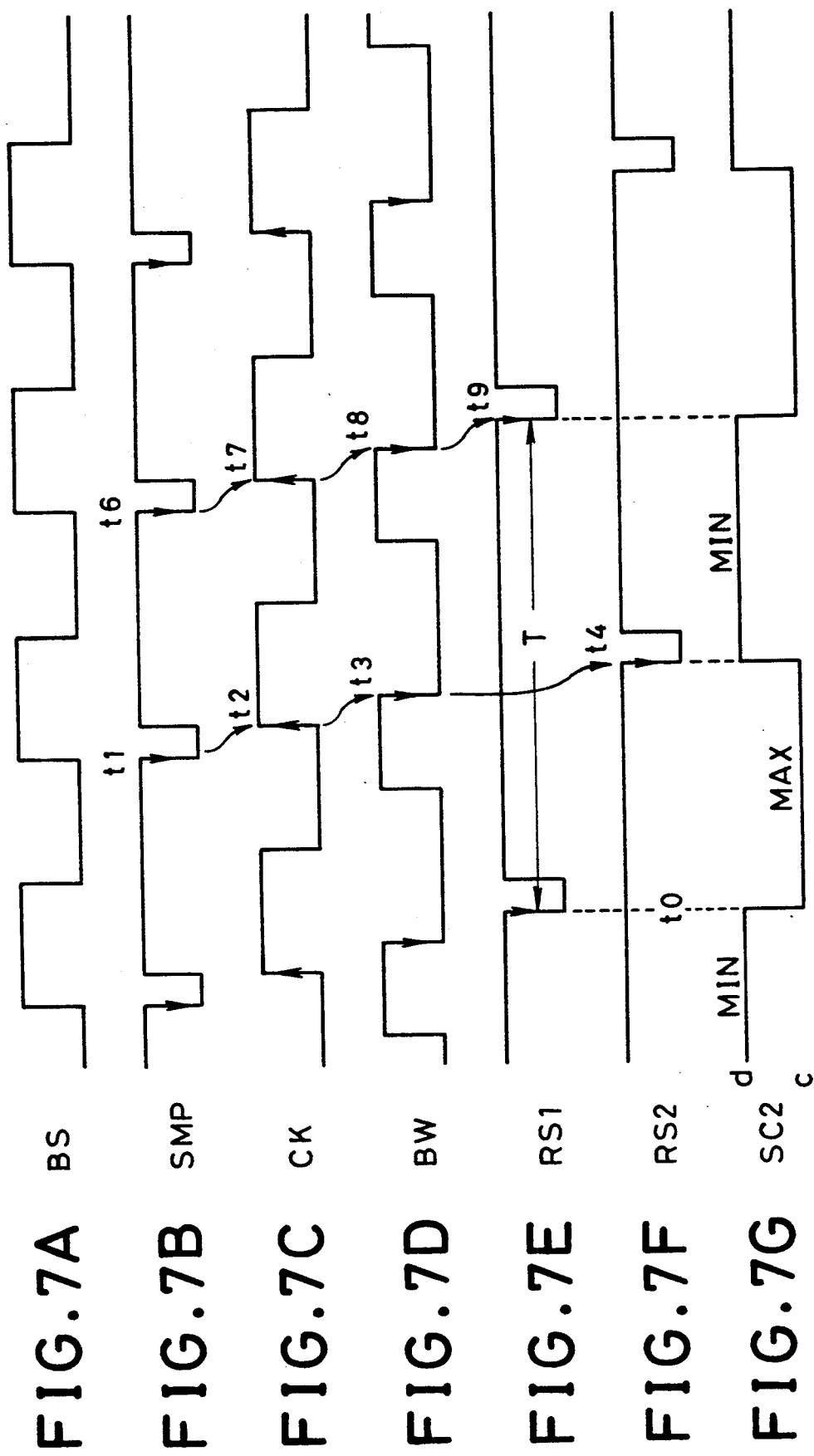
FIGS. 7A–7G are timing diagrams illustrating waveforms associated with the timing circuit of FIG. 6.

The timing circuit 31 comprises, as shown in FIG. 6, a delay circuit 61 including a plurality of delay elements connected in cascade, a logic circuit 62 including gate circuits connected to output terminals of the delay elements, a flip-flop 63 for halving an input signal fed from the logic circuit 62, and a pulsing circuit 64 for pulsing the outputs of the flip-flop 63. When the timing circuit 31 is supplied with a basic timing signal BS, illustrated in FIG. 7A, from the CPU 31, the timing circuit sequentially generates timing signals based on the signal BS, as illustrated in FIGS. 7B-7F. Incidentally, FIG. 7G shows a switch S2 control signal SC2 applied to the switch S2 from the CPU 33, as a reference. As clearly seen from FIGS. 7A and 7G, the frequency of the basic timing signal BS is twice that of the switch S2 control signal SC2.

Sampling pulses SMP illustrated in FIG. 7B, A/D clock pulses CK illustrated in FIG. 7C, and writing pulses BW illustrated in FIG. 7D have the same interval as that of the basic timing signal BS illustrated in FIG. 7A. On the other hand, reset pulses RS1 and RS2 illustrated in FIGS. 7E and 7F have an interval twice that of the basic timing signal BS. The interval of the reset pulses RS1 and RS2 defines a detection interval T for detecting the maximum and minimum values by the maximum value detection circuits 25 and 26. In addition, the minimum value reset pulses RS1 and the maximum value reset pulses RS2 occur alternately at a half detection interval T/2.

The latch 35 latches offset control data supplied from the CPU 33, and the digital-to-analog converter 38 converts the latched data into an offset control signal SFC1 which is fed to the inverting input terminal of the differential amplifier 24. Likewise, the latches 36 and 37 latch offset control data supplied from the CPU 33, and the digital-to-analog converters 39 and 40 convert the latched data into offset control signals SFC2 and SFC3 which are delivered to the maximum value detection circuits 25 and 26, respectively.

Next, the operation of this embodiment will be described below in terms of a measuring mode and a calibration mode. In the measuring mode, the switch S1 is connected to its terminal a of FIG. 5 so that an input signal is inputted to the differential amplifier 24. In contrast, in the calibration mode, the switch S1 is connected to its terminal b so that a fixed signal (a ground signal in FIG. 5) is supplied to the differential amplifier 24. First, the operation of the measuring mode is explained.

MEASURING MODE

In the measuring mode, an input signal or its envelope is outputted. To output an input signal, the CPU 33 controls the switch S2 to be connected to its terminal e to which an input signal is applied. On the other hand, to output the envelope of an input signal, the CPU 33 controls the switch S2 to be alternately connected, at a predetermined short interval, to its terminals c and d to which a maximum value and a minimum value are applied, respectively. The selected signal is converted into digital data by the sample-and-hold circuit 27 and the analog-to-digital converter 28 in accordance with the sampling pulses SMP and the A/D clock pulses CK, and is stored in the buffer memory 29.

FIGS. 7B-7D illustrate this operation. At time $t_1$, sampling pulse SMP is supplied from the timing circuit 31 to the sample-and-hold circuit 27, and subsequently, at time $t_2$, an A/D clock pulse is fed to the digital-to-analog converter 28. Thus, the sample-and-hold circuit 27 samples the input signal, and the A/D converter 28 converts the sampled analog signal into digital data. The digital signal is stored into the buffer memory 29 by a buffer write pulse BW produced at time $t_3$. The digital data stored in the buffer memory 29 is transferred to a display to be displayed.

CALIBRATION MODE

In the calibration mode, the CPU 33 controls the switch S2 to be alternately connected to its terminals c and d by using an S2 control signal SC2 as illustrated in FIG. 7G. The control signal SC2 is synchronized with the minimum value reset pulse RS1 and the maximum value reset pulse RS2. These reset pulses RS1 and RS2 are fed to the maximum value detection circuit 26 and the maximum value detection circuit 25, respectively. When the minimum reset pulse RS1 is supplied to the maximum value detection circuit 26, the switch S2 is connected to its terminal c (the maximum value side) as shown in FIG. 7G. On the other hand, when the maximum value reset pulse RS2 is applied to the maximum value detection circuit 25, the switch S2 is connected to its terminal d (the minimum value side).

The operation of the calibration mode is illustrated in FIGS. 7B-7G. At time $t_0$, the minimum value reset pulse RS1 and the S2 control signal SC2 are simultaneously outputted. Accordingly, the switch S2 is connected to the c terminal (maximum value side) so that the output of the maximum value detection circuit 25 is applied to the sample-and-hold circuit 27. In this state, when the sampling pulse SMP is applied to the sample-and-hold circuit 27 at time $t_1$, the maximum value in the detection interval T is sampled and held by the sample-and-hold circuit 27. The maximum value held in the sample-and-hold circuit 27 is converted by the analog-to-digital converter 28 in response to the A/D clock pulse CK produced at time $t_2$, and subsequently, is stored in the buffer memory 29 in response to the buffer write pulse BW produced at time $t_3$.

After that, at time $t_4$, a maximum value reset pulse RS2 is supplied from the timing circuit 31 to the maximum value detection circuit 25 so that the maximum value sampled at time $t_1$ is canceled. At the same time $t_4$, the S2 control signal SC2 is fed to the switch S2 so that the switch S2 is connected to its terminal d, i.e., the minimum value side. In this state, a minimum value in the detection interval T is applied to the sample-and-hold circuit 27. The minimum value is sampled and held in the sample-and-hold circuit 27 at time $t_6$, A/D converted by the analog-to-digital converter 28 at time $t_7$, and is stored in the buffer memory 29 at time $t_8$. After that, at time $t_9$, a minimum value reset pulse RS1 is supplied from the timing circuit 31 to the maximum value detection circuit 26 so that the minimum value sampled at time $t_6$ is canceled. Subsequently, similar operations are repeated 128 times, for example, so that 128 maximum values and 128 minimum values are stored in the buffer memory 29.

Figure 8:
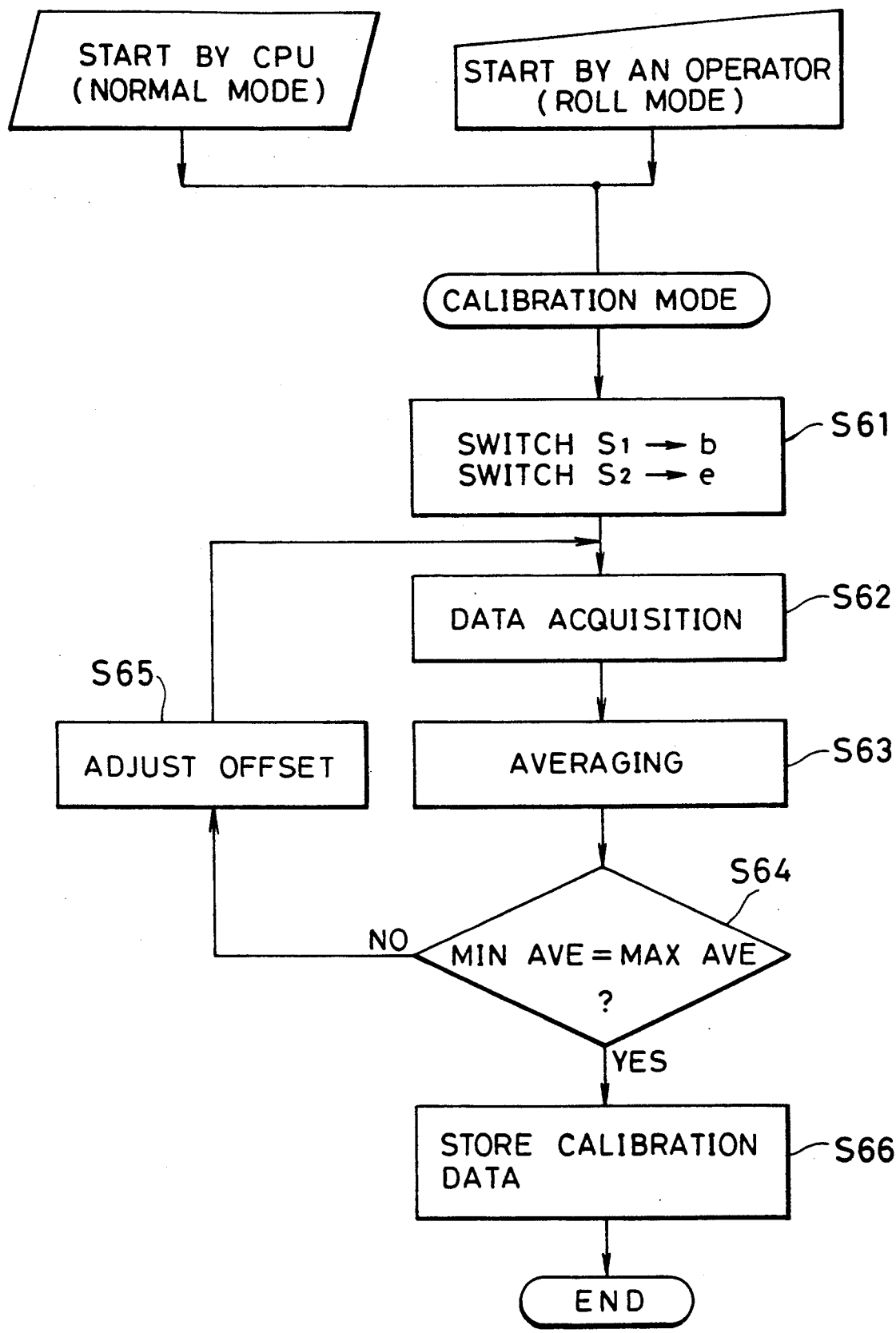
FIG. 8 is a flowchart illustrating an example of the procedure of the CPU of FIG. 5.

The digital data thus stored in the buffer memory 29 is processed as illustrated in the flowchart of FIG. 8.

As shown in FIG. 8, the calibration mode can be initiated in two ways: in a roll mode, an operator can start the calibration mode by taking predetermined steps; and in a normal mode, the CPU 33 can automatically start the calibration mode during an idling interval in which no input signal is acquired. Usually, acquisition of input signals is carried out intermittently, and hence, the idling intervals occur between acquisition intervals. The CPU 33 periodically performs the calibration automatically during these idling intervals.

When the calibration mode is started, the CPU 33 connects, at step S61, the switch S1 to its terminal b so as to ground it, and connects the switch S2 to its terminal e. In this state, the CPU 33 adjusts the voltage of the inverting terminal of the differential amplifier 24 via the latch 35 and the digital-to-analog converter 38 so that the output value of the analog-to-digital converter 28 becomes zero. Thus, offsets are canceled except for the offsets of the maximum value detection circuits 25 and 26.

At the next step S62, the switch S2 is alternately connected to its terminals c and d for a predetermined interval (for an interval 128 times the detection interval T, for example), and the same number of output data is acquired from both the maximum value detection circuits 25 and 26 as described above.

At step S63, the average of the output data of the maximum value detection circuit 25, namely, the average MAX AVE of the maximum values, and that of the maximum value detection circuit 26, namely, the average MIN AVE of the minimum values, are calculated.

At step S64, the two averages MAX AVE and MIN AVE are tested if they are equal or not. If they are not equal, the processing proceeds to step S65, where at least one of the offset signals SFC2 and SFC3 is outputted to the maximum value detection circuits 25 and 26. Thus, steps 62 through 65 are repeated until the test result at step S64 becomes positive.

When the positive result is obtained at step S64, the processing proceeds to step S65 where the current offset control signal is stored into the memory 34 as calibration data to be maintained until the next calibration data is obtained.

The reason for obtaining averages at step S63 is to eliminate effects of noise. Thus, the offset error of both the maximum value detection circuits 25 and 26 can be canceled.

EMBODIMENT 2

Figure 3:
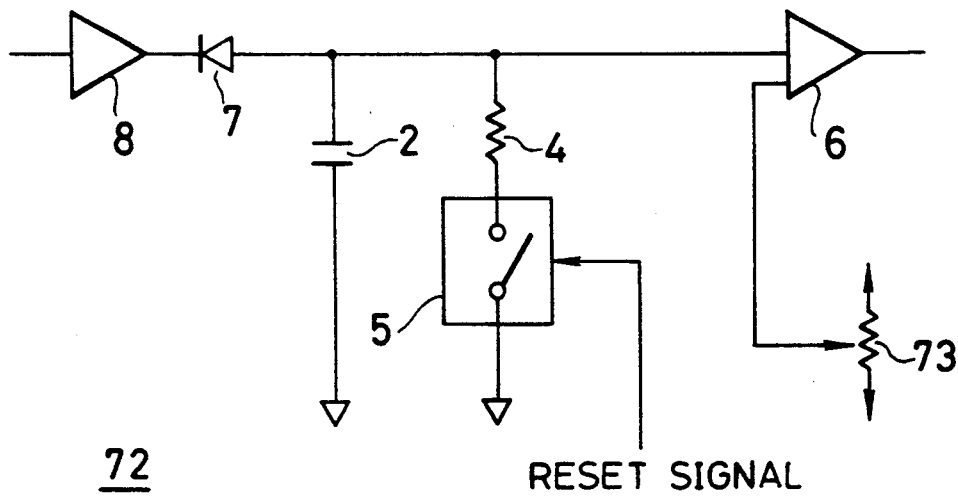
FIG. 3 is a circuit diagram showing an arrangement of a minimum value detection circuit.
Figure 4:
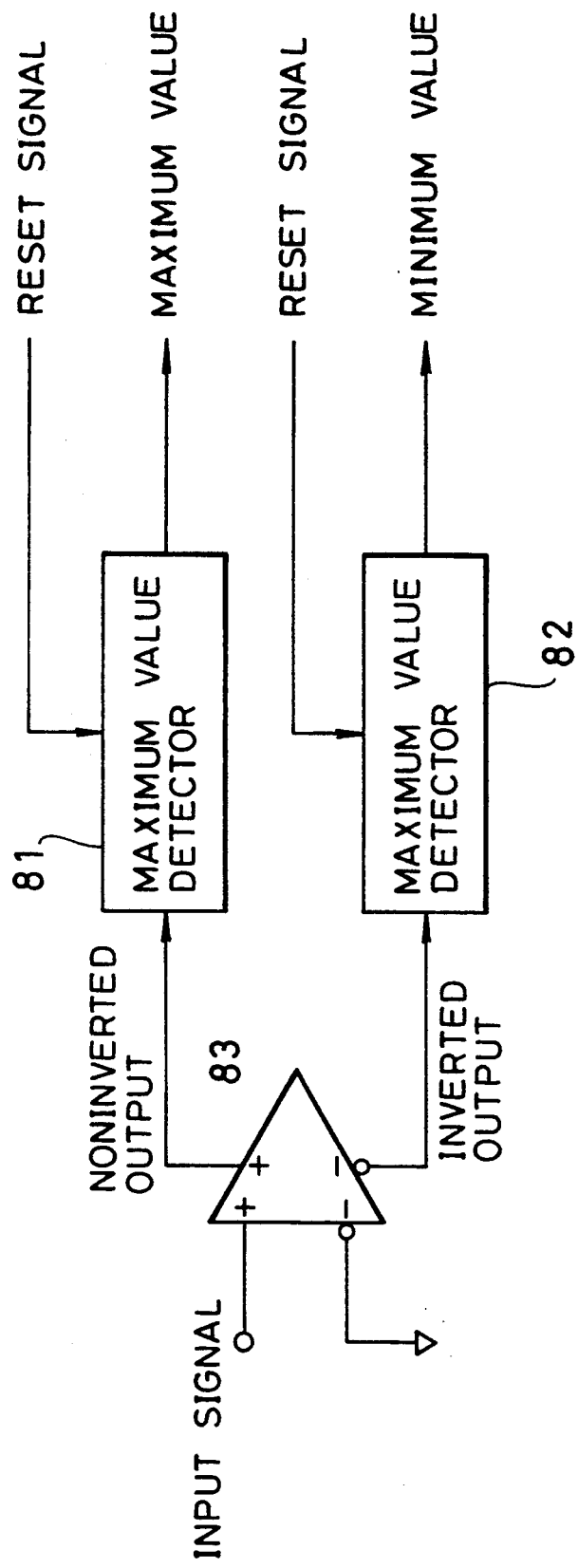
FIG. 4 is a block diagram showing an arrangement of another conventional maximum and minimum value detection apparatus.
Figure 9:
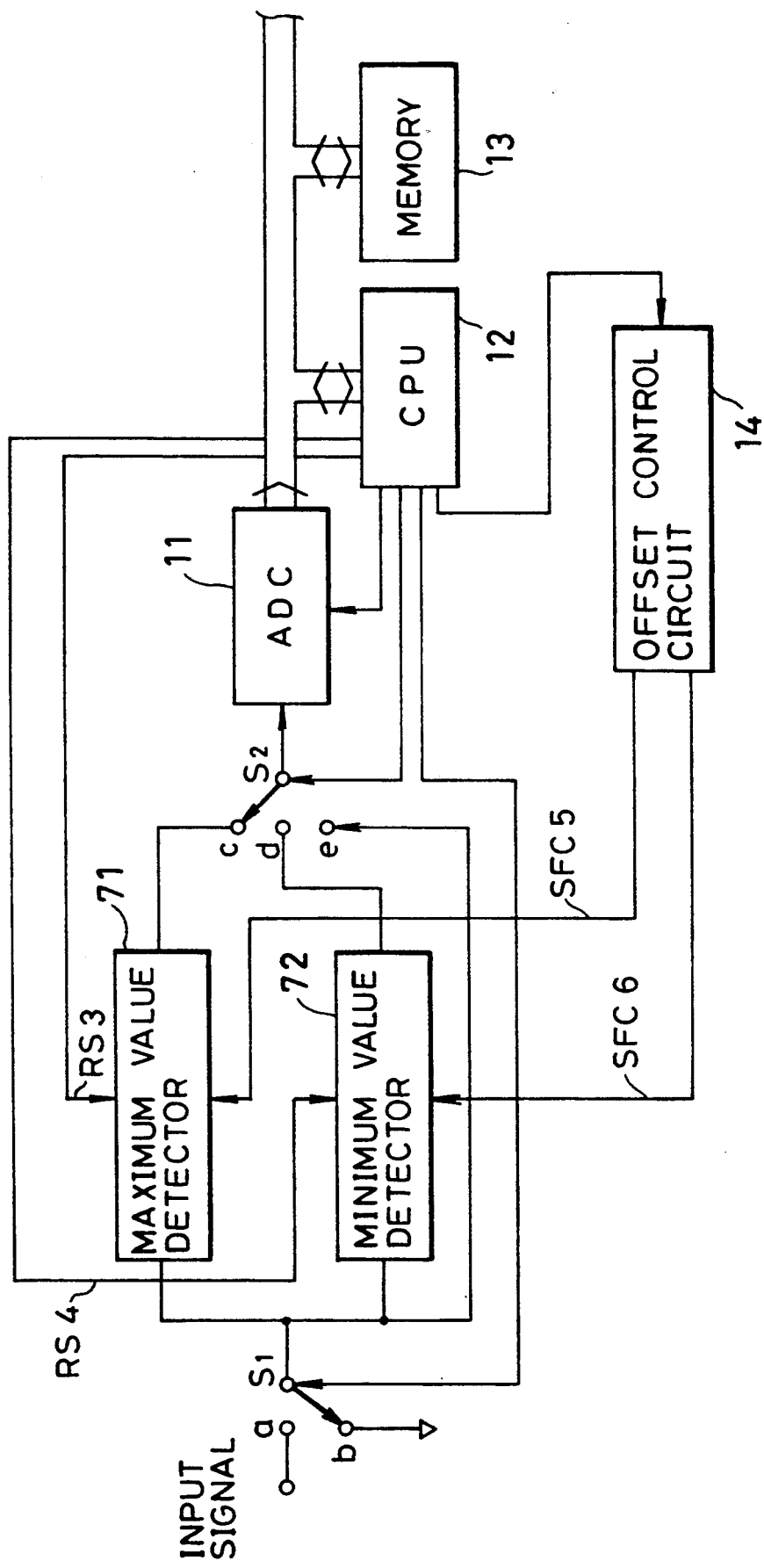
FIG. 9 is a block diagram showing an arrangement of a second embodiment of a maximum and minimum value detection apparatus according to the present invention.

FIG. 9 is a block diagram showing an arrangement of a second embodiment of the present invention. This embodiment employs the maximum value detection circuit 31 as shown in FIG. 2 and the minimum value detection circuit 72 as shown in FIG. 3. In addition, offset control signals SFC5 and SFC6 are applied to each offset voltage adjusting terminal of the buffer amplifiers 6 in the detection circuits 71 and 72.

In FIG. 9, the detection circuits 71 and 72 are selectively connected to an analog-to-digital converter 11 via a switch S2, and the output data of the analog-to-digital converter 11 is fed to a CPU 12 and a memory 13. An offset control circuit 14 comprises latches and digital-to-analog converters as in FIG. 5, and produces the offset control signals SFC5 and SFC6 in accordance with commands from the CPU 12 so as to control the offset voltages of the maximum value detection circuit 71 and the minimum value detection circuit 72. Switches S1 and S2 are controlled by the CPU 12 as in the first embodiment.

The operation of the second embodiment is similar to that of the first embodiment except for the following:

(1) In a calibration mode, an offset adjustment of circuits other than the maximum value detection circuit 71 and the minimum detection circuit 72 is not performed in the second embodiment.

(2) Data acquisition of a maximum value and a minimum value is carried out only once, and hence, the averaging operation is not performed.

Figure 10:
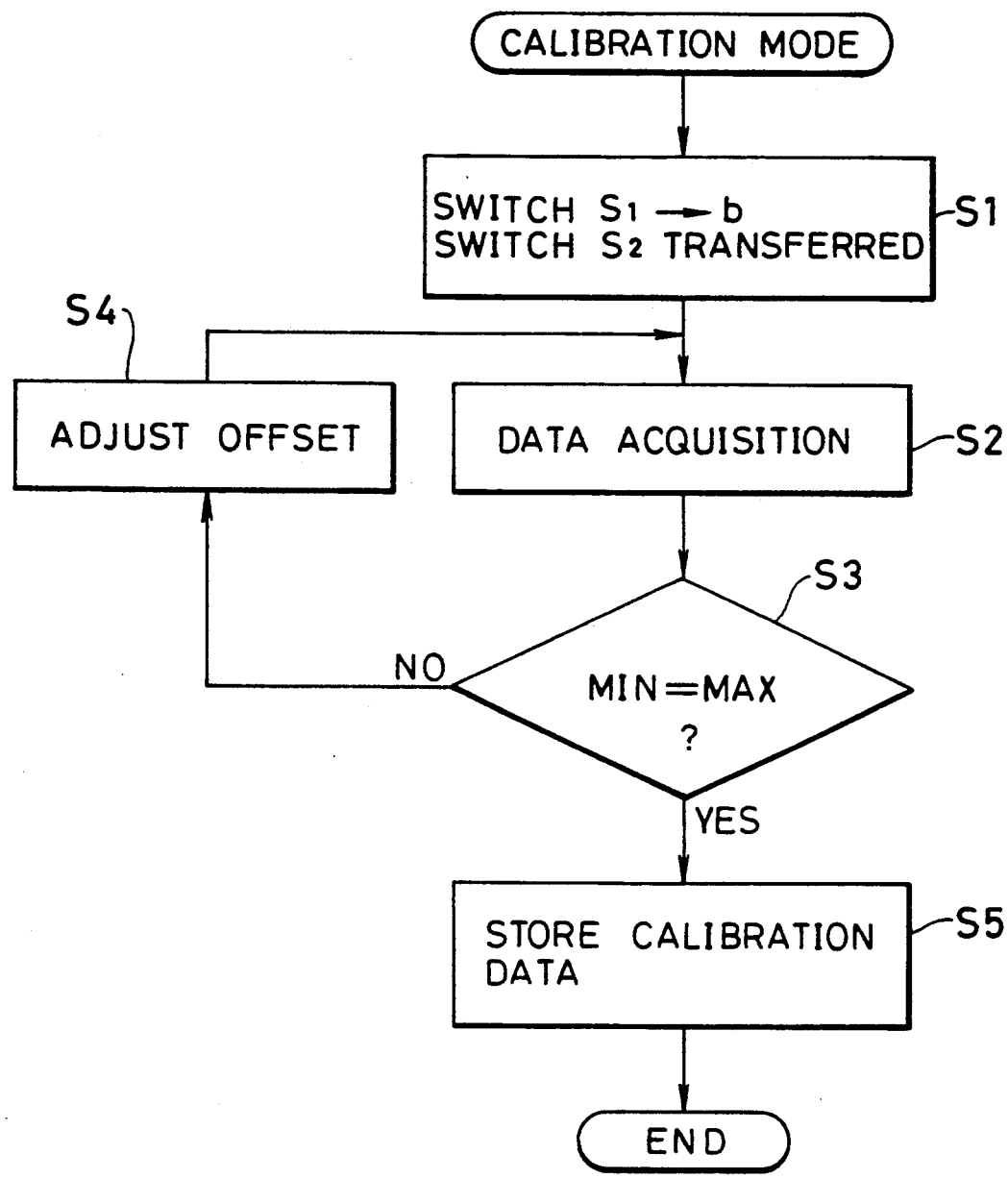
FIG. 10 is a flowchart illustrating an example of the procedure of the CPU of FIG. 9.

FIG. 10 is a flowchart showing the calibration mode operation. At step S1, the switch S1 is connected by CPU 33 to its terminal b so that the ground signal is supplied to the maximum value detection circuit 71 and the minimum value detection circuit 12.

In this state, the switch S2 is automatically first connected to its terminal c, and then to its terminal d so that a maximum value and a minimum value are acquired through the analog-to-digital converter 11, and are stored in the memory 13 at step S2.

The CPU 13 compares the data stored in the memory 13 at step S3, and controls the offsets of the maximum value detection circuit 71 and the minimum value detection circuit 72 at step S4 until the two data become equal at step S3.

When the two data become equal, the command value of the CPU 13 to the offset control circuit 14 is stored in the memory 13 as calibration data to be maintained until the next calibration data is obtained at step S5. Thus, the output difference between the maximum value detection circuit 71 and the minimum value detection circuit 72 is removed.

In the measuring mode, the CPU 12 connects the switch S1 to its terminal a so that an input signal is supplied to the maximum value detection circuit 71 and the minimum value detection circuit 72. In addition, the CPU 12 controls the switch S2 and the reset signals RS3 and RS4 so that the detection circuits 11 and 72 alternately supply their outputs to the analog-to-digital converter 11. Thus, the maximum value and minimum value at each detection interval are successively stored in the memory 13.

Although specific embodiments of a calibration circuit and method of a maximum and minimum value detection apparatus constructed in accordance with the present invention have been disclosed, it is not intended that the invention be restricted to either the specific configurations or the uses disclosed herein. Modifications may be made in a manner obvious to those skilled in the art. Accordingly, it is intended that the invention be limited only by the scope of the appended claims.

What is claimed is:

1. A calibration circuit for a maximum and minimum value detection apparatus comprising:

a maximum value detection circuit for detecting and outputting a maximum value of an input signal;

a minimum value detection circuit for detecting and outputting a minimum value of the input signal;

reference signal generating means for generating a reference signal of a fixed value which is inputted to said maximum value detection circuit and to said minimum value detection circuit upon initiation of a calibration mode; and offset control means, responsive to initiation of said calibration mode, for automatically controlling an output offset voltage supplied to at least one of said maximum value detection circuit and said minimum value detection circuit without need for manual intervention so that said maximum value and said minimum value obtained in response to said reference signal become equal.

2. The calibration circuit for a maximum and minimum value detection apparatus as claimed in claim 1, wherein said reference signal is a ground signal.

3. The calibration circuit for a maximum and minimum value detection apparatus as claimed in claim 1, wherein said maximum value detection circuit comprises:

an amplifier to which said input signal is inputted;

a diode whose anode terminal is connected to an output terminal of said amplifier;

a capacitor whose first terminal is connected to a cathode of said diode, and whose second terminal is grounded; and a buffer amplifier whose input terminal is connected to the first terminal of said capacitor.

4. The calibration circuit for a maximum and minimum value detection apparatus as claimed in claim 3, wherein said offset control means controls the output offset voltage of said maximum value detection circuit by automatically adjusting an offset control signal applied to an offset voltage adjusting terminal of said buffer amplifier.

5. The calibration circuit for a maximum and minimum value detection apparatus as claimed in claim 1, wherein said minimum value detection circuit comprises:

an amplifier to which said input signal is inputted;
a diode whose cathode terminal is connected to an output terminal of said amplifier;
a capacitor whose first terminal is connected to an anode of said diode, and whose second terminal is grounded; and
a buffer amplifier whose input terminal is connected to the first terminal of said capacitor.

6. The calibration circuit for a maximum and minimum value detection apparatus as claimed in claim 5, wherein said offset control means controls the output offset voltage of said minimum value detection circuit by automatically adjusting an offset control signal applied to an offset voltage adjusting terminal of said buffer amplifier.

7. The calibration circuit for a maximum and minimum value detection apparatus as claimed in claim 1, further comprising means for automatically and repeatedly initiating said calibration mode during intervals when no input signal is being acquired.

8. The calibration circuit for a maximum and minimum value detection apparatus as claimed in claim 1, which further includes:

an input terminal for acquiring the input signal, said maximum value and minimum value detection circuits being connected to the input terminal; and
means, connected to said input terminal, for determining an interval when no input signal is being acquired and initiating the calibration mode during an input signal interval, said reference signal generating means, responsive to said determining means, for automatically generating the reference signal upon initiation of the calibration mode, and said offset control means automatically controlling the output offset voltage during the calibration mode in response to said determining means.

9. A calibration circuit for a maximum and minimum value detection apparatus, comprising:

a differential amplifier to which an input signal to be measured is inputted;
a first maximum value detection circuit for detecting and outputting a maximum value of a non-inverted output signal of said differential amplifier;
a second maximum value detection circuit for detecting and outputting a maximum value of an inverted output signal of said differential amplifier;
reference signal generating means for generating a reference signal of a fixed value which is inputted to said first maximum value detection circuit and to said second maximum value detection circuit upon initiation of a calibration mode; and
offset control means, responsive to initiation of said calibration mode, for automatically controlling an output offset voltage supplied to at least one of said first maximum value detection circuit and said second maximum value detection circuit without need for manual intervention so that the output value of said first maximum value detection circuit and the output value of said second maximum value detection circuit obtained in response to said reference signal become equal.

10. The calibration circuit for a maximum and minimum value detection apparatus as claimed in claim 9, wherein said reference signal is a ground signal.

11. The calibration circuit for a maximum and minimum value detection apparatus as claimed in claim 9, wherein each of said maximum value detection circuits comprises:

an amplifier to which said input signal is inputted;
a diode whose anode terminal is connected to an output terminal of said amplifier;
a capacitor whose first terminal is connected to a cathode of said diode, and whose second terminal is grounded; and
a buffer amplifier whose input terminal is connected to the first terminal of said capacitor.

12. The calibration circuit of a maximum and minimum value detection apparatus as claimed in claim 9, wherein said offset control means controls output offset voltages supplied to said first and second maximum value detection circuits by automatically adjusting offset control signals separately applied to an offset voltage adjusting terminal of said buffer amplifier of each of said first and second maximum value detection circuits.

13. The calibration circuit for a maximum and minimum value detection apparatus as claimed in claim 9, further comprising means for automatically initiating said calibration mode during intervals when no input signal is being acquired.

14. A calibration method for a maximum and minimum value detection apparatus, comprising the steps of:

supplying identical level signals to a maximum value detection circuit for detecting a maximum value of an input signal, and to a maximum value detection circuit for detecting a minimum value of an input signal upon initiation of a calibration mode;
comparing an output signal of said maximum value detection circuit with an output signal of said minimum value detection circuit automatically after said step of supplying; and
using the result of said comparing step to automatically adjust an offset of at least one of said maximum value detection circuit and said minimum value detection circuit without need for manual intervention so that the output levels of said maximum value detection circuit and said minimum value detection circuit become equal.

15. A calibration method for a maximum and minimum value detection apparatus as claimed in claim 14, wherein said step of comparing comprises the steps of detecting an output value of said maximum value detection circuit a plurality of times, averaging the detected output values to produce the averaged value as the output value of said maximum value detection circuit, detecting an output value of said minimum value detection circuit a plurality of times, and averaging the detected output values to produce the averaged value as the output value of said minimum value detection circuit.

16. The calibration method for a maximum and minimum value detection apparatus as claimed in claim 14, including the step of automatically and repeatedly initiating said calibration mode during intervals when to input signal is being acquired.

* * * * *

UNITED STATES PATENT AND TRADEMARK OFFICE
CERTIFICATE OF CORRECTION

PATENT NO. : 5,287,063
DATED : February 15, 1994
INVENTOR(S) : Masao Izawa

It is certified that error appears in the above-indentified patent and that said Letters Patent is hereby corrected as shown below:

Claim 16, column 10, line 66, change "to" to --no--.

Signed and Sealed this

Eighth Day of November, 1994

BRUCE LEHMAN

Attest:

Attesting Officer

Commissioner of Patents and Trademarks